US009472545B2

(12) United States Patent
Chen et al.

(10) Patent No.: US 9,472,545 B2
(45) Date of Patent: Oct. 18, 2016

(54) SEMICONDUCTOR ARRANGEMENT WITH ELECTROSTATIC DISCHARGE (ESD) PROTECTION

(71) Applicant: Taiwan Semiconductor Manufacturing Company Limited, Hsin-Chu (TW)

(72) Inventors: Chia-Hui Chen, Hsinchu (TW); Wei Yu Ma, Taitung (TW); Kuo-Ji Chen, Wu-Ku (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/169,621

(22) Filed: Jan. 31, 2014

(65) Prior Publication Data

US 2015/0221636 A1  Aug. 6, 2015

(51) Int. Cl.
| H01L 27/02 | (2006.01) |
| H01L 27/06 | (2006.01) |
| H01L 23/522 | (2006.01) |
| H01L 23/60 | (2006.01) |
| H01L 25/065 | (2006.01) |
| H01L 27/092 | (2006.01) |
| H01L 23/48 | (2006.01) |

(52) U.S. Cl.
CPC ....... *H01L 27/0629* (2013.01); *H01L 23/5226* (2013.01); *H01L 23/60* (2013.01); *H01L 25/0657* (2013.01); *H01L 27/0251* (2013.01); *H01L 27/0688* (2013.01); *H01L 27/092* (2013.01); *H01L 23/481* (2013.01); *H01L 2225/06541* (2013.01); *H01L 2924/0002* (2013.01)

(58) Field of Classification Search
CPC ............... H01L 25/0657; H01L 2225/06541; H01L 2924/13091; H01L 23/60
See application file for complete search history.

(56) References Cited

U.S. PATENT DOCUMENTS

| 5,631,793 | A | 5/1997 | Ker et al. |
| 8,049,250 | B2* | 11/2011 | Song .................. H01L 27/0262 |
| | | | 257/110 |
| 8,232,625 | B2* | 7/2012 | Voldman ............... H01L 23/481 |
| | | | 257/621 |

(Continued)

FOREIGN PATENT DOCUMENTS

| TW | 200428633 | 12/2004 |
| TW | 201121029 | 6/2011 |
| TW | 201306231 | 2/2013 |

OTHER PUBLICATIONS

Corresponding Korean application, Korean Office action dated Nov. 9, 2015, 16 pages.

(Continued)

*Primary Examiner* — Jaehwan Oh
(74) *Attorney, Agent, or Firm* — Cooper Legal Group, LLC

(57) ABSTRACT

One or more semiconductor arrangements having a stacked configuration and electrostatic discharge (ESD) protection are provided. The semiconductor arrangements include a first substrate, a second substrate, an ESD pad, an ESD device and a first interlayer via connecting the first substrate and the second substrate. The first substrate includes a first PMOS device and a first device and the second substrate includes a first NMOS device and a second device. Alternatively, the first substrate includes a first PMOS device and a first NMOS device and the second substrate includes a first device and a second device.

20 Claims, 6 Drawing Sheets

(56) References Cited

U.S. PATENT DOCUMENTS

| | | | | |
|---|---|---|---|---|
| 8,503,186 B2* | 8/2013 | Lin | H01L 21/76898 | 257/433 |
| 9,023,688 B1* | 5/2015 | Or-Bach | H01L 21/76885 | 257/E21.532 |
| 2005/0184344 A1* | 8/2005 | Ker | H01L 23/60 | 257/360 |
| 2005/0237681 A1* | 10/2005 | Chen | H02H 9/046 | 361/56 |
| 2008/0079461 A1* | 4/2008 | Lin | H01L 21/76816 | 326/80 |
| 2009/0283898 A1* | 11/2009 | Janzen | H01L 21/76898 | 257/698 |
| 2010/0237386 A1* | 9/2010 | Lin | H01L 23/481 | 257/173 |
| 2010/0246152 A1* | 9/2010 | Lin | G06F 1/16 | 361/783 |
| 2010/0290191 A1* | 11/2010 | Lin | H01L 23/49816 | 361/704 |
| 2011/0147909 A1* | 6/2011 | Hsuan | H01L 25/0657 | 257/686 |
| 2011/0304010 A1* | 12/2011 | Jiang | H01L 23/3677 | 257/528 |
| 2012/0153437 A1* | 6/2012 | Chen | H01L 23/481 | 257/546 |
| 2013/0009278 A1* | 1/2013 | Lee | H01L 23/5252 | 257/530 |
| 2013/0093052 A1 | 4/2013 | Ma et al. | | |
| 2013/0235497 A1 | 9/2013 | Ma | | |
| 2014/0268448 A1* | 9/2014 | Tseng | H01L 27/0292 | 361/56 |

OTHER PUBLICATIONS

Corresponding Taiwan application 103146206, Taiwan Office action dated Jul. 15, 2016.

\* cited by examiner

SEMICONDUCTOR ARRANGEMENT WITH ELECTROSTATIC DISCHARGE (ESD) PROTECTION

BACKGROUND

In electronics, a three-dimensional integrated circuit (3D IC) is a device in which two or more layers of active electronic components are integrated into a single circuit. Like other circuits, 3D IC's are susceptible to electrostatic discharge (ESD) events. An ESD event is a sudden and unexpected voltage or current that transfers energy to a device. ESD events are known to render a device less operable than desired or inoperable altogether.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1:
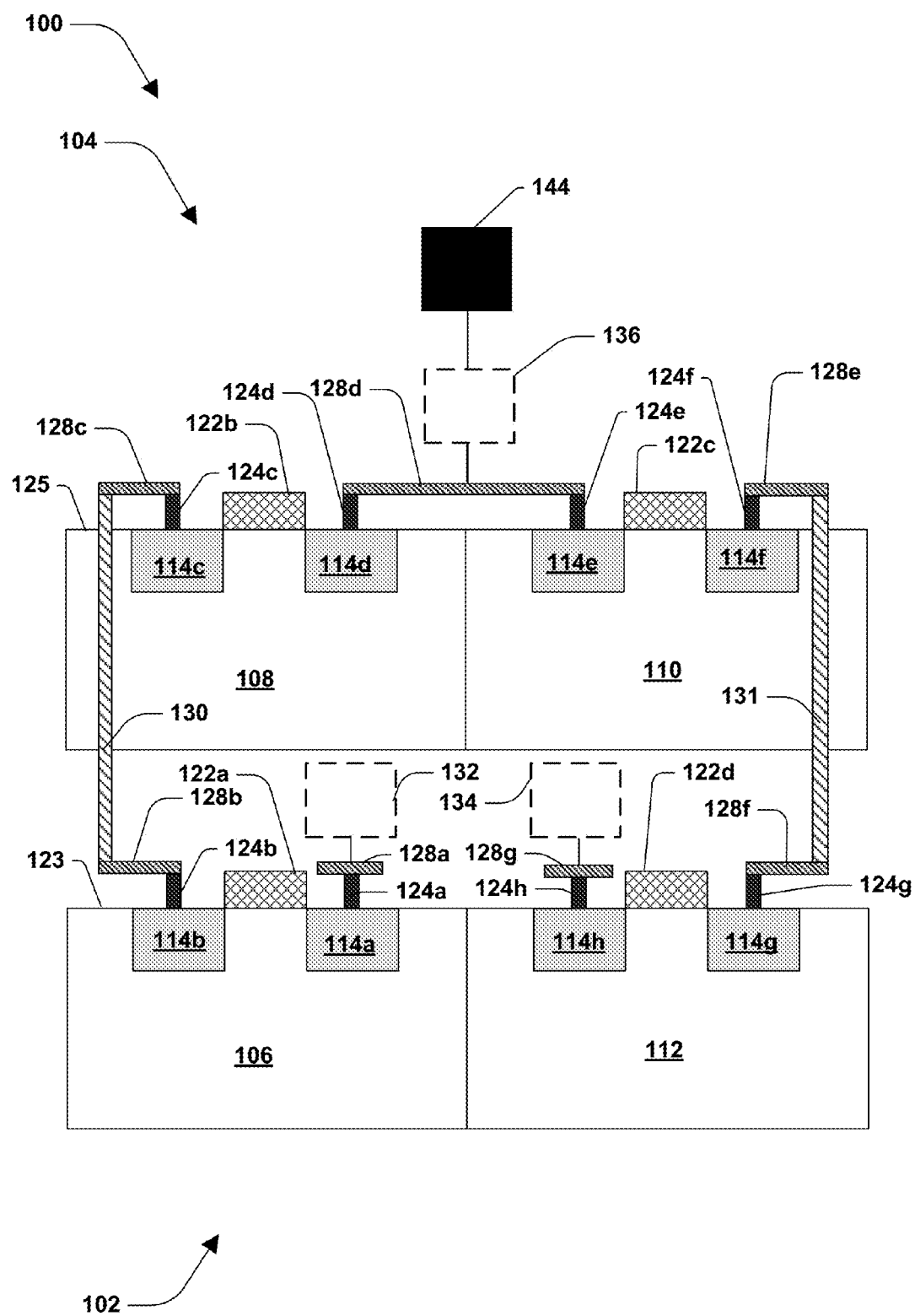
FIG. 1 is an illustration of a cross-sectional view of a semiconductor arrangement according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more semiconductor arrangements containing one or more semiconductor devices are provided herein. In some embodiments, the semiconductor arrangements include an electrostatic discharge (ESD) device. In some embodiments, the semiconductor arrangements form at least one of a three-dimensional integrated circuit (3D-IC), a 2.5-dimentional integrated circuit (2.5D-IC) or a monolithic 3D-IC.

Turning now to FIG. 1, a cross-sectional view of a first semiconductor arrangement 100 according to some embodiments is provided. In some embodiments, the first semiconductor arrangement 100 includes at least one of a first substrate 102 or a second substrate 104. In some embodiments, at least one of the first substrate 102 or the second substrate 104 is a wafer. In some embodiments, the second substrate 104 is stacked over the first substrate 102. In some embodiments, at least one of the first substrate 102 or the second substrate 104 includes at least one of silicon, germanium, silicon germanium, silicon carbide, gallium arsenic, gallium phosphide, indium phosphide, indium arsenide or indium antimonide. In some embodiments, at least one of the first substrate 102 or the second substrate 104 is a silicon-on-insulator (SOI) substrate. In some embodiments, the SOI substrate is fabricated using at least one of separation by implantation of oxygen (SIMOX) or wafer bonding.

In some embodiments, at least one of the first substrate 102 or the second substrate 104 includes at least one of a first active region 106, a second active region 108, a third active region 110 or a fourth active region 112. In some embodiments, at least one of the first active region 106 or the fourth active region 112 is on the first substrate 102 and at least one of the second active region 108 or the third active region 110 is on the second substrate 104. In some embodiments, at least one of the active regions 106, 108, 110 or 112 includes at least one of a doped region, a buried layer or an epitaxy layer. In some embodiments, the doped region includes at least one of a p-type well or a n-type well. In some embodiments, the doped region is doped with at least one of p-type dopant, such as boron or $BF_2$ or n-type dopant, such as phosphorus or arsenic.

Figure 3:
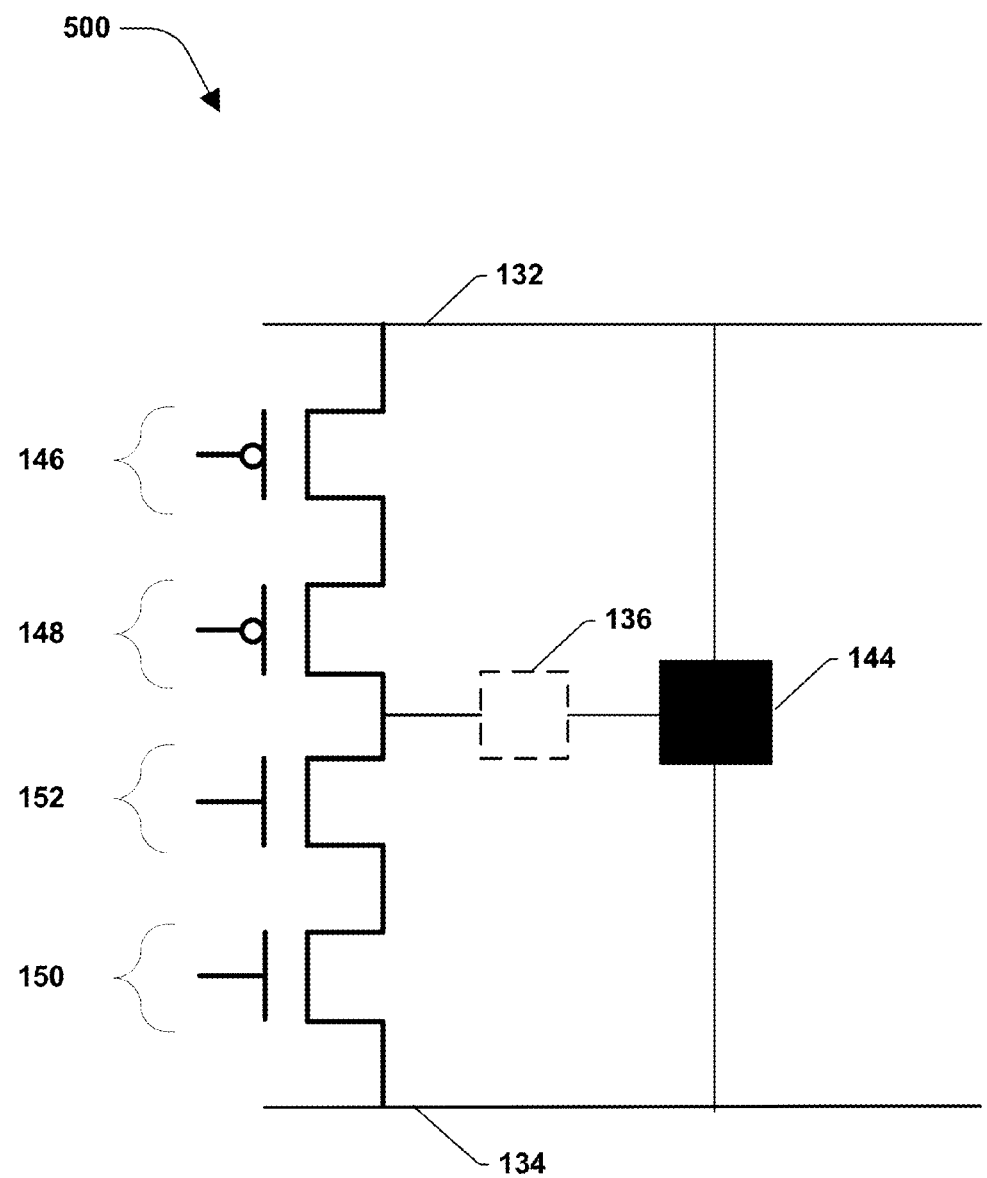
FIG. 3 is an illustration of a circuit diagram of a semiconductor arrangement according to some embodiments.

In some embodiments, at least one of the active regions 106, 108, 110 or 112 is configured as at least one of a first P-type metal-oxide-semiconductor (PMOS) device 146, a second PMOS device 148, a first N-type metal-oxide-semiconductor (NMOS) device 150 or a second NMOS device 152, as depicted in FIG. 3. In some embodiments, at least one of the first active region 106 or the second active region 108 is at least one of the first PMOS device 146 or the second PMOS device 148 and at least one of the third active region 110 or the fourth active region 112 is at least one of the first NMOS device 150 or the second NMOS device 152.

In some embodiments, the first semiconductor arrangement 100 includes source/drain (S/D) regions 114a-114h. In some embodiments, the S/D regions 114a, 114c, 114e and 114g are source regions while the S/D regions 114b, 114d, 114f and 114h are drain regions. In some embodiments, the S/D regions 114a, 114c, 114e and 114g are drain regions while S/D regions 114b, 114d, 114f and 114h are source regions. In some embodiments, the S/D regions 114a and 114b are in the first active region 106, the S/D regions 114c and 114d are in the second active region 108, the S/D regions 114e and 114f are in the third active region 110 and the S/D regions 114g and 114h are in the fourth active region 112. In some embodiments, the S/D regions 114a-114h are part of at least one of the first PMOS device 146, the second PMOS device 148, the first NMOS device 150 or the second NMOS device 152. In some embodiments, the S/D regions are formed by at least one of implant or epitaxial (epi) growth. In some embodiments, the epi growth includes at least one of a vapor-phase epitaxy (VPE), ultra-high vacuum CVD (UHV-CVD) or molecular beam epitaxy.

In some embodiments, the first semiconductor arrangement 100 includes at least one of gate structures 122a-122d. In some embodiments, at least one of the gate structures 122a or 122d is formed over a first upper surface 123 of the first substrate 102 and at least one of the gate structures 122b or 122c is formed over a second upper surface 125 of the second substrate 104.

In some embodiments, the gate structures 122a-122d include at least one of a gate dielectric layer, a sidewall spacer or a gate electrode layer. In some embodiments, the gate dielectric layer includes at least one of silicon oxide, silicon nitride, silicon oxynitride, or a high-k dielectric material. In some embodiments, the sidewall spacer includes at least one of silicon nitride, silicon oxide, silicon carbide or silicon oxynitride. In some embodiments, the gate electrode layer includes at least one of polysilicon, Al, Cu, W, Ti, Ta, TiN, TiAl, TiAlN, TaN, NiSi or CoSi. In some embodiments, the gate structures 122a-122d are formed using at least one of an atomic layer deposition (ALD), chemical vapor deposition (CVD), physical vapor deposition (PVD) or thermal oxidation process.

In some embodiments, the first semiconductor arrangement 100 includes source and drain (S/D) contacts 124a-124h. In some embodiments, the S/D contacts 124a-124h contact at least one of the S/D regions 114a-114h. In some embodiments, the S/D contact 124a contacts the S/D region 114a, the S/D contact 124b contacts the S/D region 114b, the S/D contact 124c contacts the S/D region 114c, the S/D contact 124d contacts the S/D region 114d, the S/D contact 124e contacts the S/D region 114e, the S/D contact 124f contacts the S/D region 114f, the S/D contact 124g contacts the S/D region 114g and the S/D contact 124h contacts the S/D region 114h. In some embodiments, at least one of the S/D contacts 124a-124h includes a metal, such as Ag, Al, Au, Co, Cu, Ni, Pt, W, Ti or Ta. In some embodiments, at least one of the S/D contacts 124a-124h includes Cu.

In some embodiments, at least one of the S/D contacts 114a-114h connects at least one of the (S/D) regions 114a-114h to at least one of an interlayer metal 128a-128g. In some embodiments, at least one of the S/D contact 124a contacts the interlayer metal 128a, the S/D contact 124b contacts the interlayer metal 128b, the S/D contact 124c contacts the interlayer metal 128c, the S/D contact 124d contacts the interlayer metal 128d, the S/D contact 124e contacts the interlayer metal 128d, the S/D contact 124f contacts the interlayer metal 128e, the S/D contact 124g contacts the interlayer metal 128f or the S/D contact 124h contacts the interlayer metal 128g. In some embodiments, at least one of the interlayer metals 128a-128g includes a metal, such as at least one of Al, Cu, Ni, W, Ti or Ta. In some embodiments, at least one of the interlayer metals 128a-128g includes Cu.

In some embodiments, the first semiconductor arrangement 100 includes at least one of a first interlayer via 130 or a second interlayer via 131. In some embodiments, at least one of the first interlayer via 130 or the second interlayer via 131 connects the first substrate 102 to the second substrate 104. In some embodiments, the first interlayer via 130 is connected to at least one of the interlayer metals 128b or 128c. In some embodiments, the second interlayer via 131 is connected to at least one of the interlayer metals 128e or 128f. In some embodiments, at least one of the first interlayer via 130 or the second interlayer via 131 runs through at least one of the first substrate 102 or the second substrate 104. In some embodiments, at least one of the first interlayer via 130 or the second interlayer via 131 includes a metal, such as Cu. In some embodiments, at least one of the first interlayer via 130 or the second interlayer via 131 is about 0.4 nanometers long.

In some embodiments, the first semiconductor arrangement 100 includes at least one of a VDD power supply 132 or a VSS power supply 134. In some embodiments, the VDD power supply 132 is a positive power supply and the VSS power supply 134 is at least one of a negative power supply or ground. In some embodiments, at least one of the VDD power supply 132 or the VSS power supply 134 is connected to the first substrate 102. In some embodiments, the VDD power supply 132 is connected to at least one of the first PMOS device 146 or the second PMOS device 148, as illustrated in FIG. 3. In some embodiments, the VSS power supply 134 is connected to at least one of the first NMOS device 150 or the second NMOS device 152, as illustrated in FIG. 3. In some embodiments, the VDD power supply 132 is connected to the first PMOS device 146 by at least one of the interlayer connect 128a or the S/D contact 124a. In some embodiments, the VSS power supply 134 is connected to the first NMOS device 150 by at least one of the S/D contact 124h or the interlayer metal 128g.

In some embodiments, the first semiconductor arrangement 100 includes an electrostatic discharge (ESD) pad 136. In some embodiments, the ESD pad 136 is a bond pad. In some embodiments, the ESD pad is connected between the second active region 108 and the third active region 110. In some embodiments, the ESD pad 136 is connected to the interlayer metal 128d. In some embodiments, the ESD pad is connected to an ESD device 144. In some embodiments, the ESD device 144 is a device that protects a semiconductor or circuit from ESD damage during an ESD event. In some embodiments, the ESD device 144 includes at least one of an ESD clamp or a protection circuit.

In some embodiments, the VDD power supply 132 is connected to the first active region 106, the first active region 106 is connected to the second active region 108, the second active region 108 is connected to the third active region 110, the third active region 110 is connected to the fourth active region 112 and the fourth active region 112 is connected to the VSS power supply 134. In some embodiments, the first active region 106 and the fourth active region 112 are in the first substrate 102 and the second active region 108 and the third active region 110 are in the second substrate 104. In some embodiments, the first active region 106 is a first PMOS device 146 and the second active region 108 is a second PMOS device 148, as illustrated in FIG. 3. In some embodiments, the third active region 110 is the second NMOS device 152 and the fourth active region 112 is a first NMOS device 150, as illustrated in FIG. 3. In some embodiments, the ESD pad 136 is connected between the second active region 108 and the third active region 110 and the ESD device 144 is connected to the ESD pad 136.

Figure 2:
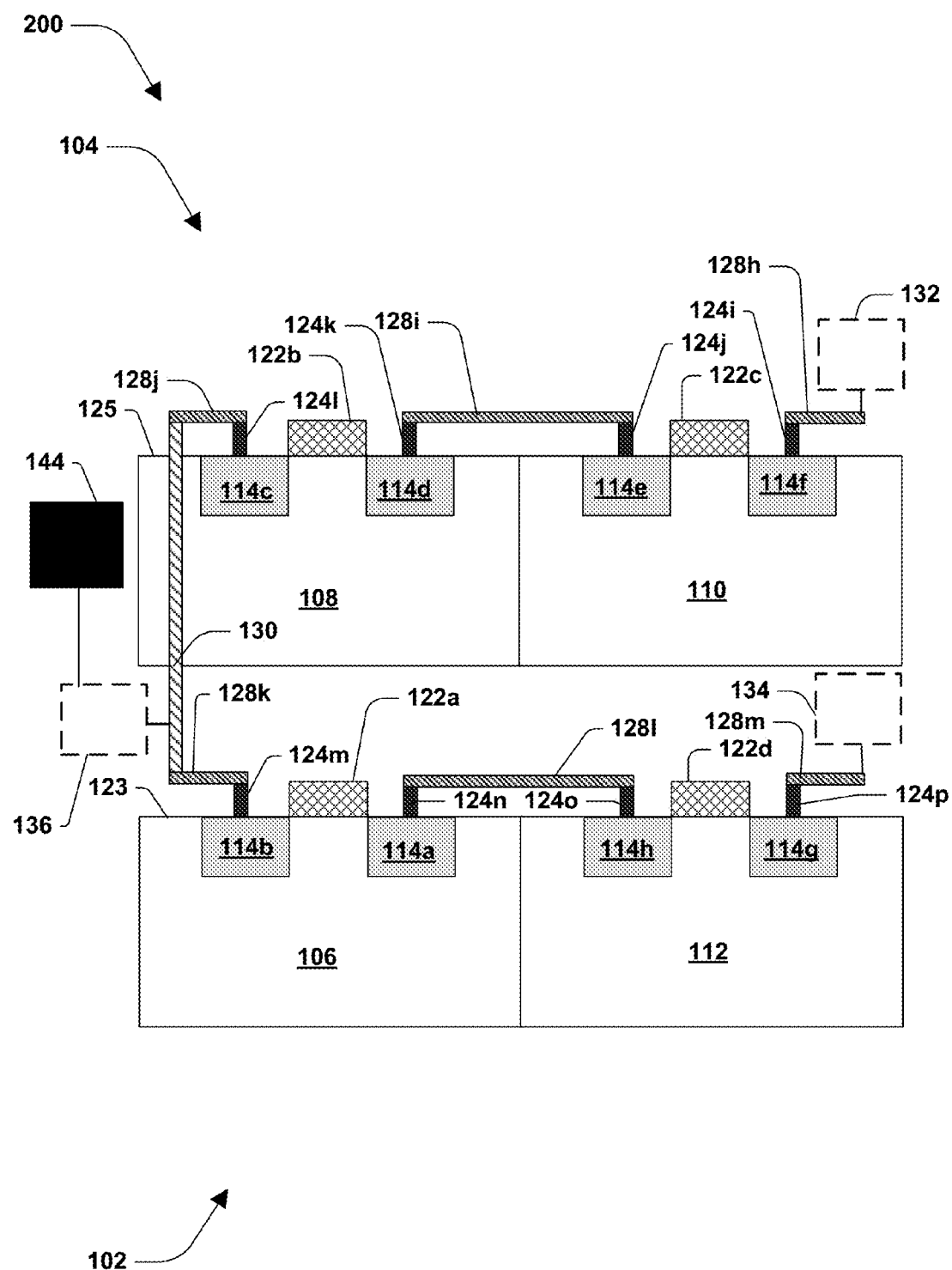
FIG. 2 is an illustration of a cross-sectional view of a semiconductor arrangement according to some embodiments.

In some embodiments, a second semiconductor arrangement 200 is provided, as illustrated in FIG. 2. In some embodiments, the second semiconductor arrangement 200 includes many of the same components as the first semiconductor arrangement 100. In some embodiments, at least one of the second active region 108 or the third active region 110 is at least one of the first PMOS device 146 or the second PMOS device 148 and at least one of the first active region 106 or the fourth active region 112 is at least one of the first NMOS device 150 or the second NMOS device 152, as illustrated in FIG. 3.

In some embodiments, the second semiconductor arrangement 200 includes S/D contacts 124i-124p. In some embodiments, S/D contacts 124i-124p contact at least one of the S/D regions 114a-114h. In some embodiments, the S/D contact 124i contacts the S/D region 114f, the S/D contact 124j contacts the S/D region 114e, the S/D contact 124k contacts the S/D region 114d, the S/D contact 124l contacts the S/D region 114c, the S/D contact 124m contacts the S/D region 114b, the S/D contact 124n contacts the S/D region 114a, the S/D contact 124o contacts the S/D region 114h and the S/D contact 124p contacts the S/D region 114g.

In some embodiments, at least one of the S/D contacts 124i-124p contacts at least one of an interlayer metal 128h-128m. In some embodiments, the S/D contact 124i contacts the interlayer metal 128h, the S/D contact 124j contacts the interlayer metal 128i, the S/D contact 124k contacts the interlayer metal 128*i*, the S/D contact 124*l* contacts the interlayer metal 128*j*, the S/D contact 124*m* contacts the interlayer metal 128*k*, the S/D contact 124*n* contacts the interlayer metal 128*l*, the S/D contact 124*o* contacts the interlayer metal 128*l* and the S/D contact 124*p* contacts the interlayer metal 128*m*. In some embodiments, at least one of the S/D contacts 124*i*-124*p* connects at least one of the (S/D) regions 114*a*-114*h* to at least one of an interlayer metal 128*h*-128*m*.

In some embodiments, the second semiconductor arrangement 200 includes at least a first interlayer via 130. In some embodiments, the first interlayer via 130 connects the first substrate 102 to the second substrate 104. In some embodiments, the first interlayer via 130 is connected to at least one of the S/D contact 124*l*, the S/D contact 124*m*, the interlayer metal 128*j* or the interlayer metal 128*k*.

In some embodiments, the VDD power supply 132 is connected to at least one of the first PMOS device 146 or the second PMOS device 148 and the VSS power supply 134 is connected to at least one of the first NMOS device 150 or the second NMOS device 152, as illustrated in FIG. 3. In some embodiments, the VDD power supply 132 is connected to the first PMOS device 146 by at least one of the interlayer connect 128*h* or the S/D contact 124*i*. In some embodiments, the VSS power supply 134 is connected to the first NMOS device 150 by at least one of the S/D contact 124*p* or the interlayer metal 128*m*.

In some embodiments, the ESD pad 136 is connected to the first interlayer via 130. In some embodiments, the ESD pad 136 is connected between at least one of the first PMOS device 146 or the second PMOS device 148 and at least one of the first NMOS device 150 or the second NMOS device 152, as illustrated in FIG. 3. In some embodiments, the ESD pad 136 is connected to the ESD device 144.

In some embodiments, the VDD power supply 132 is connected to the third active region 110, the third active region 110 is connected to the second active region 108, the second active region 108 is connected to the first active region 106, the first active region 106 is connected to the fourth active region 112 and the fourth active region 112 is connected to the VSS power supply 134. In some embodiments, the first active region 106 includes the second NMOS device 152, the second active region 108 includes the second PMOS device 148, the third active region 110 includes the first PMOS device 146 and the fourth active region 112 includes the first NMOS device 150, as illustrated in FIG. 3. In some embodiments, the ESD pad 136 is connected between the first active region 106 and the second active region 108 and the ESD device 144 is connected to the ESD pad 136.

FIG. 3 illustrates a circuit diagram 500 of at least one of the first semiconductor arrangement 100 or the second semiconductor arrangement 200. In some embodiments, during normal operation at least one of the first PMOS device 146 and the second PMOS device 148 or the first NMOS device 150 and the second NMOS device 152 will turn off or on to apply at least one of a current or a voltage to at least one of the gate structures 122*a*-122*d*. In some embodiments, during normal operation, the first PMOS device 146 and the second PMOS device 148 are in the off state and the first NMOS device 150 and second NMOS device 152 are in the on state, such that the ESD device 144 has little to no influence on a current or voltage applied to the ESD pad 136 or other IC circuitries.

In some embodiments, during an ESD event, the ESD device 144 is trigged or turned on by a trigger voltage such that at least one of the first PMOS device 146 and the second PMOS device 148 or the first NMOS device 150 and the second NMOS device 152 will turn off or on. In some embodiments, when the trigger voltage is reached, the current or voltage enters the ESD device 144 through the ESD pad 136 to bypasses a victim. In some embodiments, when the trigger voltage is reached at least one of the current or voltage enters the ESD device 144 in order to dissipate the current or voltage to a safe level to protect the victim. In some embodiments, at least one of the first PMOS device 146, the second PMOS device 148, the first NMOS device 150 or the second NMOS device 152 is the victim. In some embodiments, at least one of the first semiconductor arrangement 100 or the second semiconductor arrangement 200 increases the trigger voltage of victim circuit. In some embodiments, the trigger voltage is increased because at least one of the first PMOS device 146 and the second PMOS device 148 or the first NMOS device 150 and the second NMOS device 152 are in a series or dual stage configuration. In some embodiments, the trigger voltage for at least one of the first semiconductor arrangement 100 or the second semiconductor arrangement 200 is about twice that of a single stage device.

Figure 4:
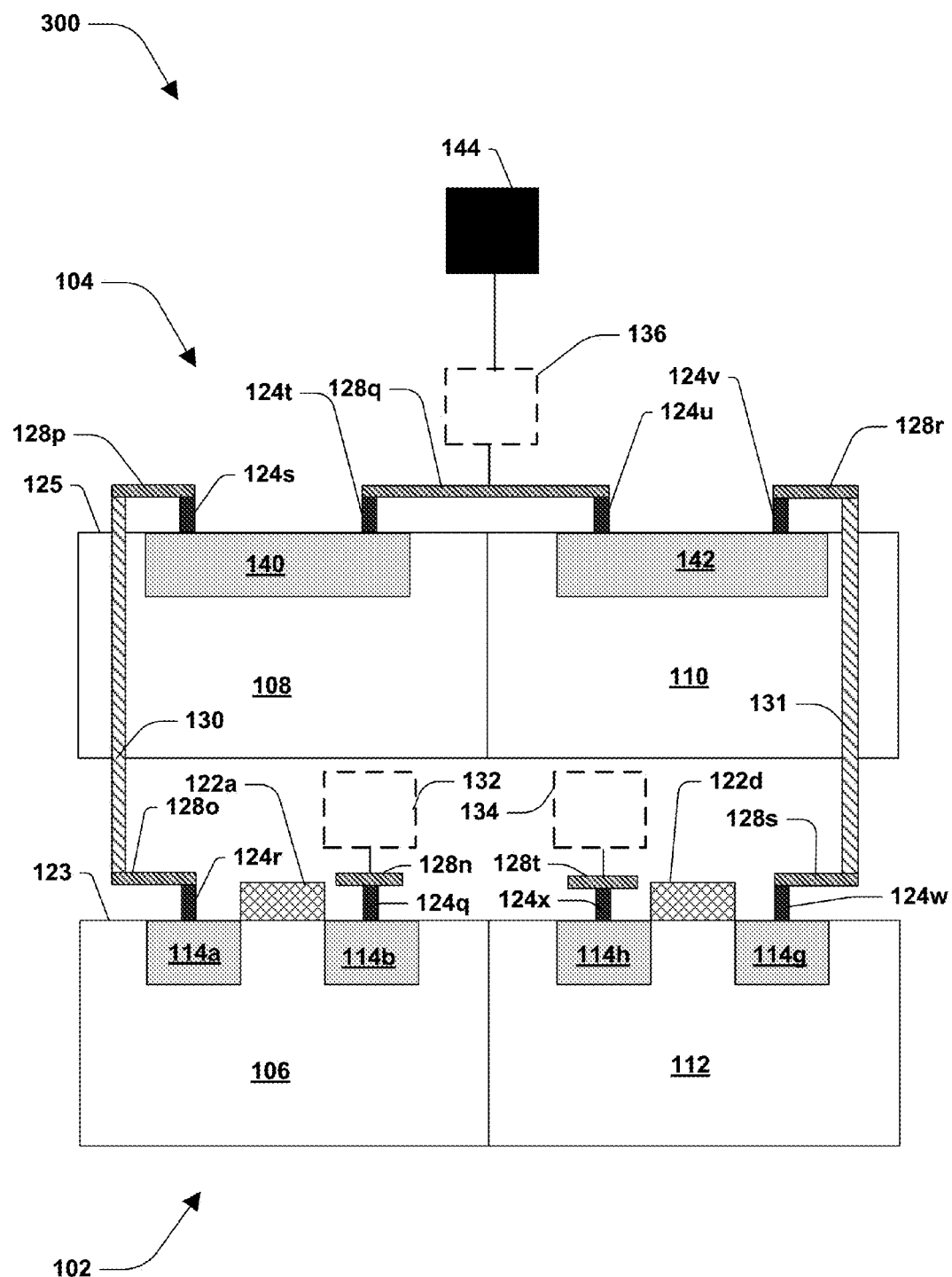
FIG. 4 is an illustration of a cross-sectional view of a semiconductor arrangement according to some embodiments.
Figure 6:
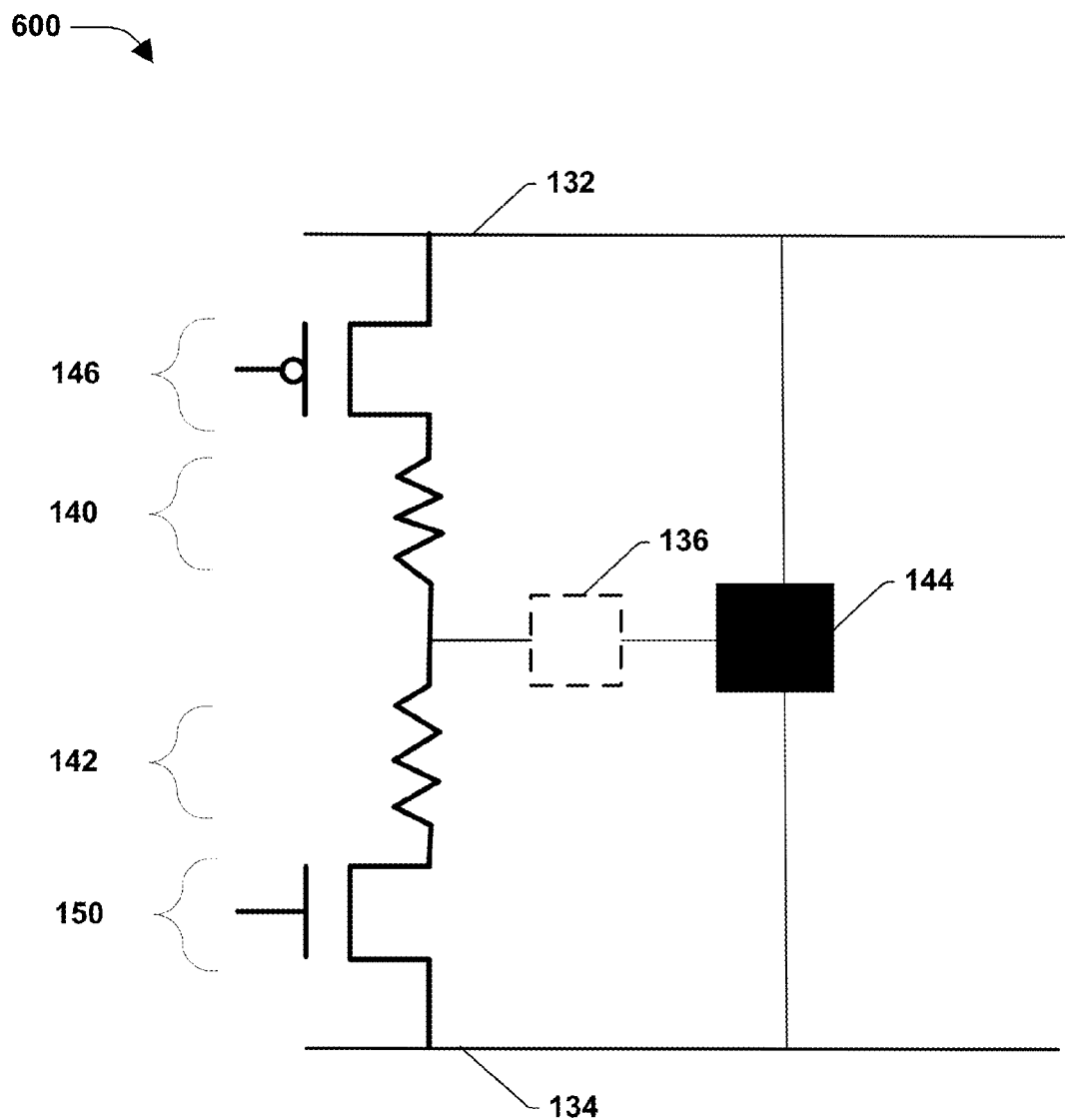
FIG. 6 is an illustration of a circuit diagram of a semiconductor arrangement according to some embodiments.

In some embodiments, a third semiconductor arrangement 300 is provided, as illustrated in FIG. 4. In some embodiments, the third semiconductor arrangement 300 includes many of the same components as the first semiconductor arrangement 100. In some embodiments, at least one of the first active region 106 or the fourth active region 112 is at least one of a first PMOS device 146 or a first NMOS device 150, as illustrated in FIG. 6. In some embodiments, at least one of the second active region 108 or the third active region 110 is at least one of a first device or a second device, as illustrated in FIG. 3. In some embodiments, at least one of the first device or the second device includes at least one of a first resistor 140, a second resister 142, a second PMOS device 148 or a second NMOS device 152. In some embodiments, the first active region 106 is the first PMOS device 146, the second active region 108 is the first resistor 140, the third active region 110 is the second resistor 142 and the fourth active region 112 is the first NMOS device 150, as illustrated in FIG. 6.

In some embodiments, at least one of the first resistor 140 or the second resistor 142 is an OD resistor (active area resistor). In some embodiments, the OD resistor includes a silicide block mask layer. In some embodiments, at least one of the first resistor 140 or the second resistor 142 includes at least one of a n-well, a p-well, a p+-implant, n+-implant , a metal or a high-k material. In some embodiments, at least one of the first resistor 140 or the second resistor 142 is able to simulate at least one of a voltage, current or impedance characteristic of at least one of the first PMOS device 146 or the first NMOS device 150.

In some embodiments, the third semiconductor arrangement 300 includes S/D contacts 124*q*-124*x*. In some embodiments, S/D contacts 124*q*-124*x* contact at least one of the first resistor 140, the second resistor 142 or the S/D regions 114*a*, 114*b*, 114*g* or 114*h*. In some embodiments, the S/D contact 124*q* contacts the S/D region 114*a*, the S/D contact 124*r* contacts the S/D region 114*b*, the S/D contact 124*s* contacts the first resistor 140, the S/D contact 124*t* contacts the first resistor 140, the S/D contact 124*u* contacts the second resistor 142, the S/D contact 124*v* contacts the second resistor 142, the S/D contact 124*w* contacts the S/D region 114*h* and the S/D contact 124*x* contacts the S/D region 114*g*.

In some embodiments, at least one of the S/D contacts 124*q*-124*x* contacts at least one of an interlayer metal 128n-128t. In some embodiments, the S/D contact 124q contacts the interlayer metal 128n, the S/D contact 124r contacts the interlayer metal 128o, the S/D contact 124s contacts the interlayer metal 128p, the S/D contact 124t contacts the interlayer metal 128q, the S/D contact 124u contacts the interlayer metal 128q, the S/D contact 124v contacts the interlayer metal 128r, the S/D contact 124w contacts the interlayer metal 128s and the S/D contact 124x contacts the interlayer metal 128t. In some embodiments, at least one of the S/D contacts 124q-124x connects at least one of the first resistor 140, the second resistor 142 or the S/D regions 114a, 114b, 114g or 114h to at least one of an interlayer metal 128n-128t.

In some embodiments, the third semiconductor arrangement 300 includes at least one of the first interlayer via 130 or the second interlayer via 131. In some embodiments, at least one of the first interlayer via 130 or the second interlayer via 131 connects the first substrate 102 to the second substrate 104. In some embodiments, the first interlayer via 130 is connected to at least one of the S/D contact 124r, the S/D contact 124s, the interlayer metal 128o or the interlayer metal 128p. In some embodiments, the second interlayer via 131 is connected to at least one of the S/D contact 124v, the S/D contact 124w, the interlayer metal 128r or the interlayer metal 128s.

In some embodiments, at least one of the VDD power supply 132 or the VSS power supply is connected to at least one of the first PMOS device 146 or the first NMOS device 150. In some embodiments, the VDD power supply 132 is connected to the first PMOS device 146 by at least one of the interlayer connect 128n or the S/D contact 124q. In some embodiments, the VSS power supply 134 is connected to the first NMOS device 150 by at least one of the S/D contact 124x or the interlayer metal 128t.

In some embodiments, the ESD pad 136 is connected to the interlayer connect 128q. In some embodiments, the ESD pad 136 is connected between the first device and the second device. In some embodiments, the ESD pad 136 is connected between the first resistor 140 and the second resistor 142. In some embodiments, the ESD pad 136 is connected to the ESD device 144.

In some embodiments of the semiconductor arrangement 300, the VDD power supply 132 is connected to the first active region 106, the first active region 106 is connected to the second active region 108, the second active region 108 is connected to the third active region 110, the third active region 110 is connected to the fourth active region 112 and the fourth active region 112 is connected to the VSS power supply 134. In some embodiments, the first active region 106 includes a first PMOS device 146, the second active region 108 includes a first resistor 140, the third active region 110 includes a second resistor 142 and the fourth active region 112 includes a first NMOS device 150, as illustrated in FIG. 6. In some embodiments, the ESD pad 136 is connected between the first resistor 140 and the second resistor 142 and an ESD device 144 is connected to the ESD pad 136.

Figure 5:
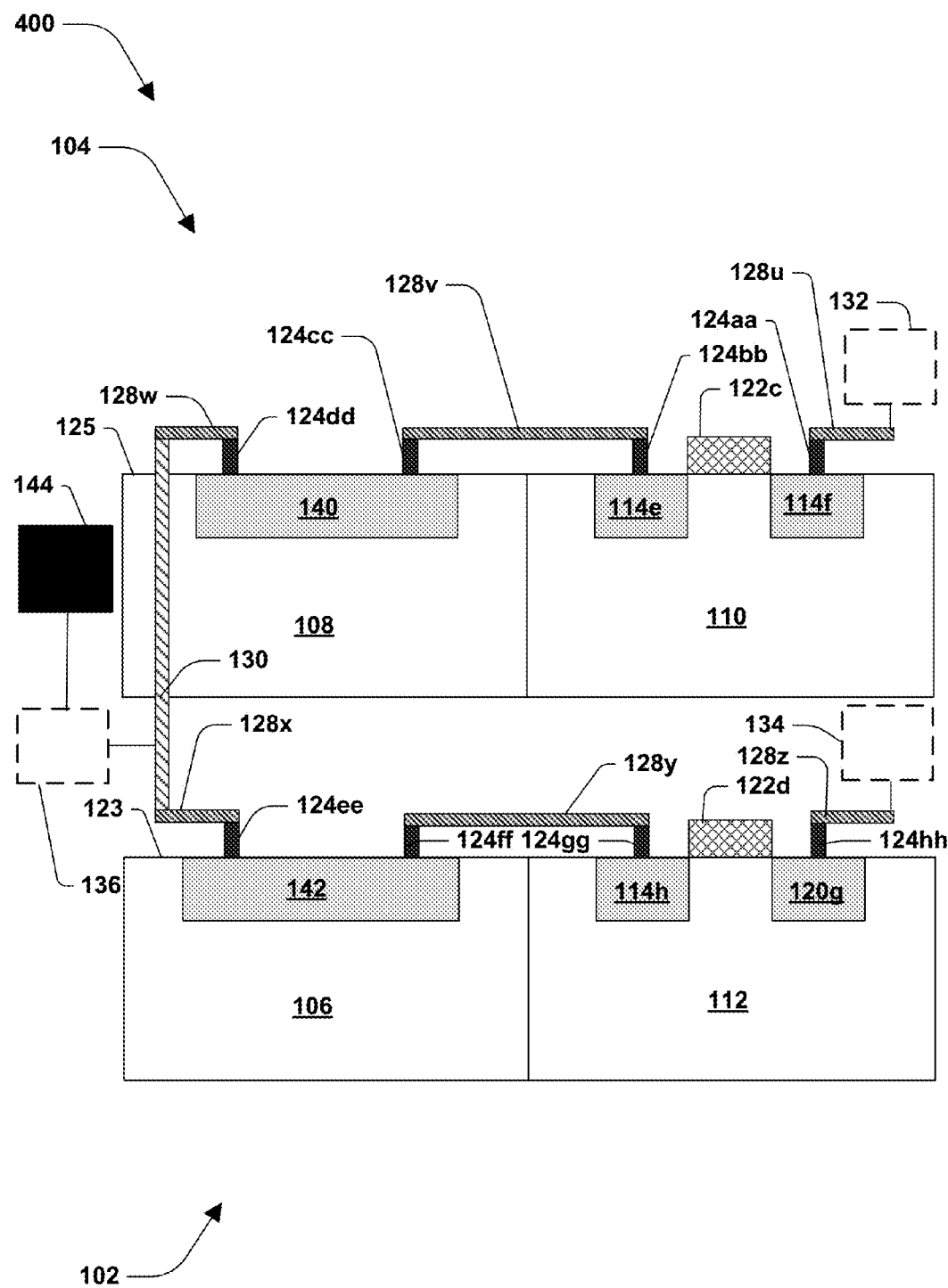
FIG. 5 is an illustration of a cross-sectional view of a semiconductor arrangement according to some embodiments.

In some embodiments, a fourth semiconductor arrangement 400 is provided, as illustrated in FIG. 5. In some embodiments, the fourth semiconductor arrangement 400 includes many of the same components as the first semiconductor arrangement 100. In some embodiments, at least one of the third active region 110 or the fourth active region 112 is at least one of the first PMOS device 146 or the first NMOS device 150, as illustrated in FIG. 6. In some embodiments, at least one of the first active region 106 or the second active region 108 is at least one of a first device or a second device, as illustrated in FIG. 6. In some embodiments, at least one of the first device or the second device includes at least one of a first resistor 140, a second resister 142, a second PMOS device 148 or a second NMOS device 152. In some embodiments, the third active region 110 is the first PMOS device 146, the second active region 108 is the first resistor 140, the first active region 106 is the second resistor 142 and the fourth active region 112 is the first NMOS device 150.

In some embodiments, at least one of the first resistor 140 or the second resistor 142 is an OD resistor (active area resistor). In some embodiments, the OD resistor includes a silicide block mask layer. In some embodiments, at least one of the first resistor 140 or the second resistor 142 includes at least one of a n-well, a p-well, a metal or a high-k material. In some embodiments, at least one of the first resistor 140 or the second resistor 142 is able to simulate at least one of a voltage, current or impedance characteristic of at least one of the first PMOS device 146 or the first NMOS device 150.

In some embodiments, the fourth semiconductor arrangement 400 includes S/D contacts 124aa-124hh. In some embodiments, S/D contacts 124aa-124hh contact at least one of the first resistor 140, the second resistor 142 or the S/D regions 114e-11h. In some embodiments, the S/D contact 124aa contacts the S/D region 114f, the S/D contact 124bb contacts the S/D region 114e, the S/D contact 124cc contacts the first resistor 140, the S/D contact 124dd contacts the first resistor 140, the S/D contact 124ee contacts the second resistor 142, the S/D contact 124ff contacts the second resistor 142, the S/D contact 124gg contacts the S/D region 114h and the S/D contact 124hh contacts the S/D region 114g.

In some embodiments, at least one of the S/D contacts 124aa-124hh contacts at least one of an interlayer metal 128u-128z. In some embodiments, the S/D contact 124aa contacts the interlayer metal 128u, the S/D contact 124bb contacts the interlayer metal 128v, the S/D contact 124cc contacts the interlayer metal 128v, the S/D contact 124dd contacts the interlayer metal 128w, the S/D contact 124ee contacts the interlayer metal 128x, the S/D contact 124ff contacts the interlayer metal 128y, the S/D contact 124gg contacts the interlayer metal 128y and the S/D contact 124hh contacts the interlayer metal 128z. In some embodiments, at least one of the S/D contacts 124aa-124bb connects at least one of the (S/D) regions 114e-114h to at least one of an interlayer metal 128u-128z.

In some embodiments, the fourth semiconductor arrangement 400 includes at least a first interlayer via 130. In some embodiments, the first interlayer via 130 connects the first substrate 102 to the second substrate 104. In some embodiments, the first interlayer via 130 is connected to at least one of the S/D contact 124dd, the S/D contact 124ee, the interlayer metal 128w or the interlayer metal 128x.

In some embodiments, at least one of the VDD power supply 132 or the VSS power supply 134 is connected to at least one of the first PMOS device 146, the first resistor 140, the first NMOS device 150 or the second resistor 142, as illustrated in FIG. 6. In some embodiments, the VDD power supply 132 is connected to the first PMOS device 146 by at least one of the S/D contact 124aa or the interlayer connect 128u. In some embodiments, the VSS power supply 134 is connected to the second NMOS device 152 by at least one of the S/D contact 124hh or the interlayer metal 128z.

In some embodiments, the ESD pad 136 is connected to the first interlayer via 130. In some embodiments, the ESD pad 136 is connected between the first active region 106 and the second active region 108. In some embodiments, the ESD pad 136 is connected between the first device and the second device. In some embodiments, the ESD pad 136 is connected to the ESD device 144.

In some embodiments, the VDD power supply 132 is connected to the first PMOS device 146, the first PMOS device 146 is connected to the first resistor 140, the first resistor 140 is connected to the second resistor 142, the second resistor 142 is connected to the first NMOS device and the first NMOS device 150 is connected to the VSS power supply 134. In some embodiments, the ESD pad 136 is connected to between the first resistor 140 and the second resistor 142. In some embodiments, at least one of a current or voltage flows from at least one of the VDD power supply 132 or the VSS power supply 134 to the ESD pad 136. In some embodiments, an ESD device 144 is connected to the ESD pad 136.

FIG. 6 illustrates a circuit diagram 600 of at least one of the third semiconductor arrangement 300 or the fourth semiconductor arrangement 400. In some embodiments, during normal operation at least one of the first PMOS device 146 or the first NMOS device 150 will turn off or on to apply at least one of a current or a voltage to at least one of the gate structures 122a-122d. In some embodiments, during normal operation, the first PMOS device 146 is in the off state and the first NMOS device 150 is in the on state, such that the ESD device 144 has little to no influence on a current or voltage applied to the ESD pad 136. In some embodiments, the first resistor 140 or the second resistor 142 has a proper resistor value for impedance matching, respectively.

In some embodiments, during an ESD event, the ESD device 144 is trigged or turned on by a trigger voltage such that at least one of the first PMOS device 146 or the first NMOS device 150 will turn off or on. In some embodiments, when the trigger voltage is reached, the current or voltage enters the ESD device 144 through the ESD pad 136 to bypasses a victim. In some embodiments, when the trigger voltage is reached at least one of the current or voltage enters the ESD device 144 in order to dissipate the current or voltage to a safe level to protect the victim. In some embodiments, at least one of the first PMOS device 146 or the first NMOS device 150 is the victim. In some embodiments, at least one of the third semiconductor arrangement 300 or the fourth semiconductor arrangement 400 increases the trigger voltage. In some embodiments, the trigger voltage is increased because at least one of the first PMOS device 146 and the first resistor 140 or the first NMOS device 150 and the second resistor 142 are in a series or dual stage configuration. In some embodiments, the trigger voltage for at least one of the third semiconductor arrangement 300 or the fourth semiconductor arrangement 400 is about twice that of a single stage device.

In some embodiments, at least one of the semiconductor arrangements 100, 200, 300 or 400 reduce Latch-up keep out zone limitations by placing a Latch-up trigger source and a victim in separate substrates and thus increases a distance between the trigger source and the victim. In some embodiments, a Latch-up event is prevented.

In some embodiments, at least one of the semiconductor arrangements 100, 200, 300 or 400 is manufactured by at least one of a face-to-face 3D IC process or a face-to-back 3D IC process.

According to some aspect of the instant disclosure, a semiconductor arrangement is provided. The semiconductor arrangement comprising a first substrate, a second substrate, an electrostatic discharge (ESD) pad and a first interlayer via connecting the first substrate and the second substrate. The first substrate comprising a first PMOS device and a first NMOS device. The second substrate comprising a first device and a second device. The ESD pad connected between the first device and the second device.

According to some aspect of the instant disclosure, a semiconductor arrangement is provided. The semiconductor arrangement comprising a first substrate, a second substrate, an electrostatic discharge (ESD) pad and a first interlayer via connecting the first substrate and the second substrate. The first substrate comprising a first PMOS device and a first NMOS device. The second substrate comprising a first NMOS device and a second device. The ESD pad connected between the first device and the second device.

According to some aspect of the instant disclosure, a semiconductor arrangement is provided. The semiconductor arrangement comprising a first substrate, a second substrate, an electrostatic discharge (ESD) pad, an ESD device connected to the ESD pad, a first interlayer via and a second interlayer via. The first substrate comprising a first PMOS device and a first NMOS device. The second substrate comprising a first device and a second device. The ESD pad connected between the first device and the second device. The first interlayer via between the first PMOS device and the first device and the second interlayer via between the first NMOS device and the second device.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement comprising:
   a first substrate comprising:
      a first PMOS device comprising a first source/drain region coupled to a first power supply supplying a first voltage; and
      a first NMOS device comprising a first source/drain region coupled to a second power supply supplying a second voltage different than the first voltage;
   a second substrate comprising:
      a first device coupled to a second source/drain region of the first PMOS device; and
      a second device coupled to a second source/drain region of the first NMOS device;
   an electrostatic discharge (ESD) pad coupled between the first device and the second device, wherein there is no current path between the ESD pad and a gate of the first PMOS device or a gate of the first NMOS device; and
   a first interlayer via coupling the first substrate and the second substrate.

2. The semiconductor arrangement of claim 1, wherein the first interlayer via couples the first PMOS device to the first device.

3. The semiconductor arrangement of claim 1, wherein at least one of the first device or the second device is at least one of a second PMOS device, a second NMOS device, a first resistor or a second resistor.

4. The semiconductor arrangement of claim 1, wherein the first device is a second PMOS device and the second device is a second NMOS device.

5. The semiconductor arrangement of claim 1, wherein the first device is a first resistor and the second device is a second resistor.

6. The semiconductor arrangement of claim 1, the first power supply corresponding to a positive voltage power supply and the second power supply corresponding to at least one of a negative voltage power supply or ground.

7. The semiconductor arrangement of claim 1, comprising:
   an ESD device coupled to the ESD pad.

8. The semiconductor arrangement of claim 1, wherein the first substrate and the second substrate are in a stacked configuration.

9. A semiconductor arrangement comprising:
   a first substrate comprising:
      a first PMOS device comprising a first source/drain region coupled to a first power supply supplying a first voltage; and
      a first device coupled to a second source/drain region of the first PMOS device;
   a second substrate comprising:
      a first NMOS device comprising a first source/drain region coupled to a second power supply supplying a second voltage different than the first voltage; and
      a second device coupled to a second source/drain region of the first NMOS device;
   an electrostatic discharge (ESD) pad coupled between the first device and the second device, wherein there is no current path between the ESD pad and a gate of the first PMOS device or a gate of the first NMOS device; and
   a first interlayer via coupling the first substrate and the second substrate.

10. The semiconductor arrangement of claim 9, wherein the first interlayer via couples the first device to the second device.

11. The semiconductor arrangement of claim 9, wherein at least one of the first device or the second device is at least one of a second PMOS device, a second NMOS device, a first resistor or a second resistor.

12. The semiconductor arrangement of claim 9, wherein the first device is a second PMOS device and the second device is a second NMOS device.

13. The semiconductor arrangement of claim 9, wherein the first device is a first resistor and the second device is a second resistor.

14. The semiconductor arrangement of claim 9, the first power supply corresponding to a positive voltage power supply and the second power supply corresponding to at least one of a negative voltage power supply or ground.

15. The semiconductor arrangement of claim 9, comprising:
   an ESD device coupled to the ESD pad.

16. The semiconductor arrangement of claim 9, wherein the first substrate and the second substrate are in a stacked configuration.

17. A semiconductor arrangement comprising:
   a first substrate comprising:
      a first PMOS device, comprising:
         a first source/drain region coupled to a first power supply supplying a first voltage; and
         a second source/drain region; and
      a first NMOS device, comprising:
         a first source/drain region coupled to a second power supply supplying a second voltage different than the first voltage; and
         a second source/drain region;
   a second substrate comprising:
      a first resistor having a first terminal coupled to the second source/drain region of the first PMOS device; and
      a second resistor having a first terminal coupled to the second source/drain region of the first NMOS device; and
   an electrostatic discharge (ESD) pad coupled to a second terminal of the first resistor and a second terminal of the second resistor.

18. The semiconductor arrangement of claim 17, wherein there is no current path between the ESD pad and a gate of the first PMOS device or a gate of the first NMOS device.

19. The semiconductor arrangement of claim 17, wherein there is no current path between the ESD pad and a gate of the first PMOS device and there is no current path between the ESD pad and a gate of the first NMOS device.

20. The semiconductor arrangement of claim 17, wherein the first substrate and the second substrate are in a stacked configuration.

* * * * *